United States Patent
Horn et al.

(10) Patent No.: US 6,917,234 B2
(45) Date of Patent: Jul. 12, 2005

(54) POWER SWITCH ARRANGEMENT AND TURN-OFF METHOD THEREFOR

(75) Inventors: Wolfgang Horn, Villach (AT); Peter Singerl, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/745,272

(22) Filed: Dec. 23, 2003

(65) Prior Publication Data

US 2004/0212418 A1 Oct. 28, 2004

(30) Foreign Application Priority Data

Dec. 23, 2002 (DE) .......................................... 102 60 650

(51) Int. Cl.$^7$ ................................................ H03L 5/00
(52) U.S. Cl. ...................... 327/309; 327/378; 327/513
(58) Field of Search ............................... 327/309, 318, 327/321, 378, 387, 389, 512–513

(56) References Cited

U.S. PATENT DOCUMENTS

| 4,709,160 | A | * | 11/1987 | Kinoshita | .................. 327/475 |
| 6,108,183 | A | * | 8/2000 | Beene | ........................ 361/93.8 |
| 6,860,347 | B2 | * | 3/2005 | Sinclair et al. | ................ 180/11 |

FOREIGN PATENT DOCUMENTS

| DE | 2803557 A | * | 8/1979 | ............. F02P/3/04 |
| JP | 2001085618 | | 3/2001 | |
| WO | WO 03/034590 | | 4/2003 | |

* cited by examiner

Primary Examiner—Timothy P. Callahan
Assistant Examiner—Cassandra Cox
(74) Attorney, Agent, or Firm—Dicke, Billig & Czaja, PLLC

(57) ABSTRACT

The invention relates to a power switch arrangement having a semiconductor power switch connected by its load path serially in a load circuit, and a clamping circuit, which is connected between a control electrode terminal and a load-side electrode terminal of the semiconductor power switch. Upon the turn-off of the semiconductor power switch, a clamping voltage is set across the load path thereof. The power switch arrangement additionally has a temperature estimator, which supplies an estimated value corresponding to an instantaneous peak temperature of the semiconductor power switch that occurs directly after the turn-off instant of the semiconductor power switch. The power switch arrangement also has a control device that generates, after the turn-off instant a control signal that is fed to the clamping circuit, if the estimated temperature value has a magnitude that corresponds to a temperature value of the semiconductor power switch that exceeds the maximum desired temperature of said semiconductor power switch. The control device controls the clamping circuit in such a way that the latter sets the clamping voltage in such a way that the protected peak temperature does not exceed the maximum desired temperature, a minimum voltage value of the clamping voltage not being exceeded, which value is determined in such a way that the change in the load current through the semiconductor power switch with respect to time does not become positive and is subsequently increased, first gradually and then very rapidly again.

20 Claims, 4 Drawing Sheets

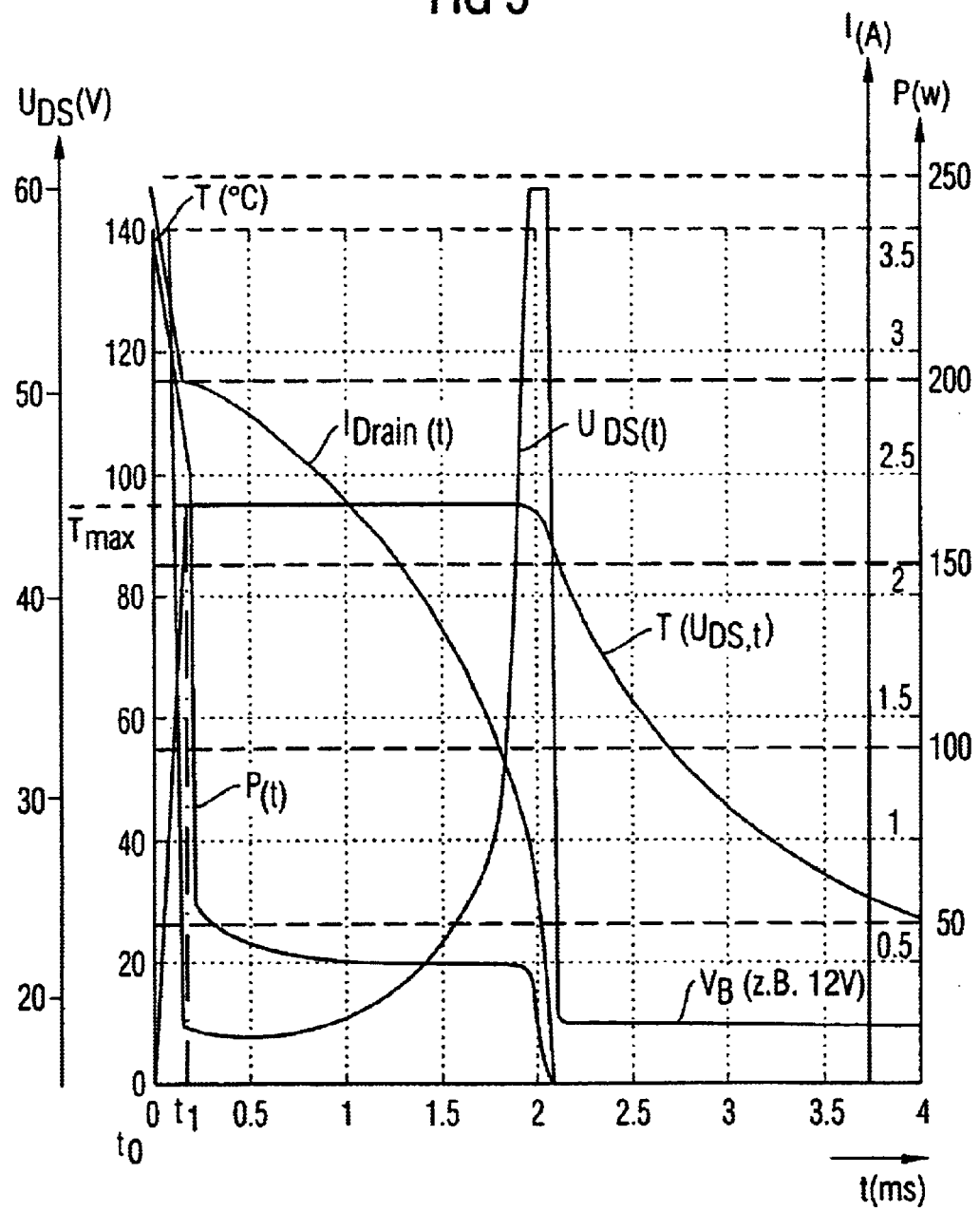

POWER SWITCH ARRANGEMENT AND TURN-OFF METHOD THEREFOR

CROSS-REFERENCE TO RELATED APPLICATIONS

This Utility patent application claims priority to German Patent Application No. DE 102 60 650.1, filed on Dec. 23, 2002, which is incorporated herein by reference.

BACKGROUND

The invention relates to a power switch arrangement having a semiconductor power switch connected by its load path serially in a load circuit, and a clamping circuit, which is connected between a control electrode terminal and a load-side electrode terminal of the semiconductor power switch and, upon turn-off of the semiconductor power switch, sets a clamping voltage across the load path thereof.

In order to relatively rapidly switch off inductive loads with integrated semiconductor power switches, use is made of a clamping circuit which limits the output voltage, that is to say the voltage dropped across the load path, e.g. of a power switching transistor, to a maximum value Vc, which lies below the maximum technology voltage (for example, 60 V). During switch-off operation, a high power loss is converted in the power switching transistor, said power loss depending on the supply voltage, for example a battery voltage, and the energy stored in the inductance of the load. The so-called maximum clamping energy, in other words that energy which can be converted in the power switching transistor without leading to the destruction thereof, is an essential parameter in the specification and should be as large as possible. Said clamping energy depends on the semiconductor technology used, the cooling conditions and the area of the power switching transistor. With advancing miniaturization of the components, the size of the power transistor is determined more and more often by the clamping energy and not by the resistance.

In power switch arrangements that have been customary hitherto, the output voltage during the turn-off operation has been limited to a constant value Vds(t)=constant. The accompanying FIG. 1 shows a customary power switch arrangement that is configured as a low-side power switch. The load path D-S of a power transistor 10, which in this case is an N-channel MOSFET, for example, is connected in a load circuit in series with a load symbolized by an inductance L and a resistance component R. With the supply voltage $V_B$, the voltage Vc is dropped across the load path D-S of the power transistor 10 in the turned-off, that is to say opened, state thereof. As mentioned, a clamping circuit is provided in power switch arrangements of this type, said clamping circuit being designated by the reference numeral 11 in FIG. 1 and limiting the voltage dropped across the load path D-S of the power transistor 10 in the turn-off case, that is to say with power transistor 10 opened, to a constant value. What is disadvantageous is that this solution is not the optimum with regard to the energy consumption capability of the power transistor.

Investigations have shown that the destruction of the power transistor, in the case of excessively high energy, is brought about by a maximum permissible peak temperature of the power transistor being exceeded or by repeated excessively large temperature swing.

In view of the abovementioned disadvantages of the known power switch arrangement, an improved power switch arrangement and an improved turn-off method for turn-off of an inductive load, so that the energy consumption capability of the semiconductor power switch can be increased, would be an improvement in the art.

SUMMARY

In accordance with one embodiment of the invention, a power switch arrangement has a temperature estimator, which supplies an estimated value corresponding to an instantaneous peak temperature of the semiconductor power switch, and a control device, which generates an actuating signal fed to the clamping circuit, if the estimated value of the temperature of the semiconductor power switch has a magnitude corresponding to a temperature value of the semiconductor power switch that exceeds a maximum desired temperature of said semiconductor power switch, and the clamping circuit reduces the clamping voltage, and hence the instantaneous power in the semiconductor power switch, depending on the actuating signal fed to it. In one embodiment, the semiconductor power switch may be a MOSFET.

Thus, the clamping circuit configured according to one embodiment of the invention, by virtue of its connection to the temperature estimator, during the turn-off operation, prescribes a time-variable clamping voltage that is optimized such that a predetermined maximum temperature or a maximum temperature swing of the semiconductor power switch is not exceeded. Of course, the energy that can be consumed is still limited and its being exceeded would lead to the destruction of the semiconductor power switch even in the case of a power switch arrangement according to one embodiment of the invention. However, in the case of the power switch arrangement according to the invention, the values given an optimized profile of the clamping voltage are about 70% higher than those with a constant clamping voltage. In the case of energy-limited transistors, this leads to an area saving of about 70%.

Furthermore, the power switch arrangement according to one embodiment of the invention, ensures that a minimum clamping voltage which is high enough to prevent the load current from rising again is prescribed for the semiconductor power switch or power transistor in the turn-off case.

The temperature estimator may either have a simple temperature sensor or contain a more complicated arrangement which supplies more accurate estimated values.

According to one embodiment of the invention, the control device has a control amplifier, which, on the input side, receives a voltage—specifying the estimated temperature value—from the temperature estimator and a voltage specifying the maximum desired temperature and generates an output voltage specifying the actuating signal from a comparison of the two received voltage values.

In one embodiment, the clamping circuit has a transistor, which receives the output voltage from the control amplifier at a control electrode, and a series circuit comprising at least a first zener diode, with a further zener diode. The transistor of the clamping circuit is turned on upon reception of the actuating signal and bridges the first zener diode, the further zener diode prescribing the minimum clamping voltage. The latter, in the case where the power switch arrangement is supplied by a battery, may be set to a maximum permissible battery voltage.

Like the known arrangement shown in FIG. 1, the power switch arrangement may form a low-side switch in which the load lies on the side of the power transistor with higher potential, and may contain an n-channel MOSFET, for example, as the power transistor. As an alternative, the invention may also be used for a high-side switch. The power transistor may also be realized as a p-channel MOSFET transistor.

In a method according to the invention for the turn-off of a power switch arrangement, in which a clamping voltage is set across the load path of a power switching element connected serially in a load circuit, is characterized by the fact that an estimated value is determined for the instantaneous peak temperature of the power transistor and the clamping voltage is reduced if the estimated instantaneous peak temperature exceeds a predetermined maximum temperature.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 is a signal timing diagram illustrating the temporal profile of essential quantities in the case of the power switch arrangement according to the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 2:
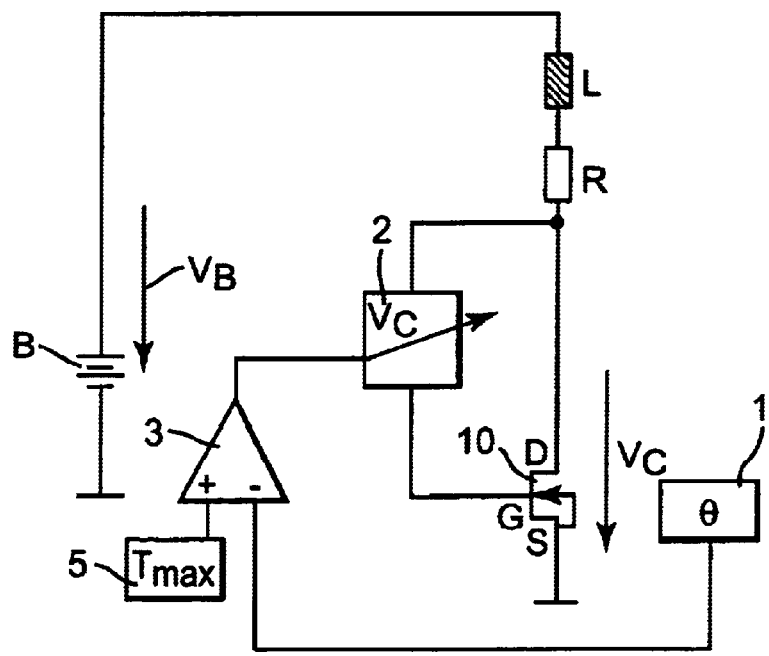
FIG. 2 illustrates a circuit arrangement of a principle of the power switch arrangement according to the invention.

In accordance with FIG. 2, a series circuit formed by the load path D-S of a semiconductor power switch 10, which in this case is an n-channel MOS power transistor, for example, with a load circuit formed by an inductance L and a nonreactive resistor R is supplied from a battery B, which supplies the battery voltage $V_B$. A clamping circuit 2 according to one embodiment of the invention prescribes a temporal profile for the clamping voltage $V_{c(t)}$ which is optimized such that a predetermined maximum temperature or a maximum temperature swing of the power transistor 10 is not exceeded.

Thus, beginning from an instant that the power transistor 10 is turned off, an optimum temporal profile for the clamping voltage $V_c$ is found. This optimum solution is dependent on a multiplicity of parameters: the inductance L and the resistance loss R of the load, the initial temperature of the power transistor 10, the load current at the switch-off instant t0 (i.e., the instant power transistor 10 is turned off), the thermal impedance (cooling) and so on. Since determining these parameters on the chip, if possible at all, would necessitate an unrealistically high outlay, the invention implements a turn-off method with the aid of the power switch arrangement shown in FIG. 2. The method leads to an optimum temporal profile of the clamping voltage Vc. A temperature estimator 1 supplies an estimated value for the instantaneous peak temperature θ of the power transistor 10. In this case, the temperature estimator 1 may be a simple temperature sensor or a more complicated arrangement that supplies more accurate estimated values. Starting from the instant of the turn-off of power transistor 10, the clamping circuit 2 firstly prescribes a constant clamping voltage Vc, as in the case of the known power switch arrangement which is described in the introduction and illustrated in FIG. 1. If the temperature estimator 1 detects an exceeding of a predetermined maximum temperature $T_{max}$, which is symbolized in FIG. 2 by a generator 5 supplying a constant voltage, a control amplifier 3 is used to reduce the clamping voltage Vc and hence the instantaneous power in the power transistor 10. This prevents a further rise in the peak temperature and thus a destruction of the power transistor 10. The clamping circuit 2 also defines a minimum clamping voltage that is high enough to prevent the load current from rising again after its turn-off. The minimum clamping voltage may be, for example, the maximum permissible voltage $V_{Bmax}$ of the battery B that supplies the load circuit comprising the power transistor 10 and the load L, R.

Figure 3:
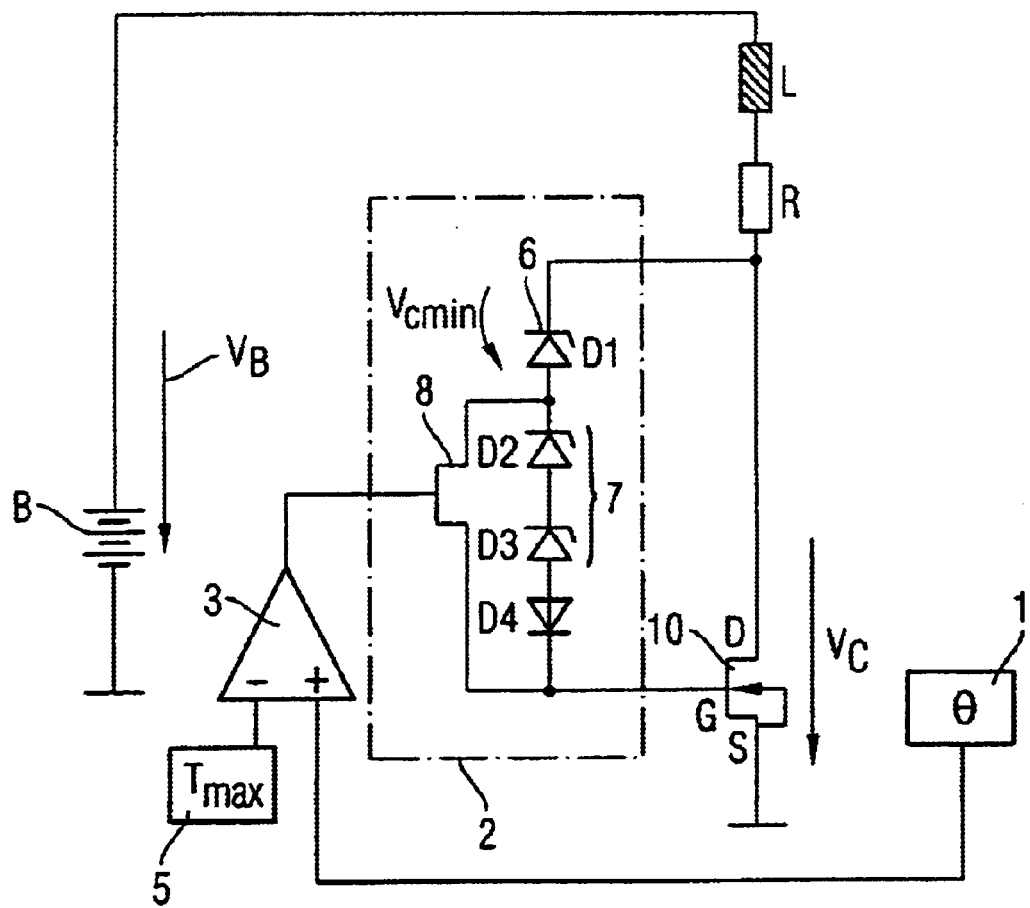
FIG. 3 illustrates a circuit arrangement of a particular embodiment of the power switch arrangement according to the invention, illustrated in principle in FIG. 2.

A more detailed exemplary embodiment of the clamping circuit 2 is shown in FIG. 3. If the voltage, which specifies the instantaneous peak value of the temperature θ of the power transistor 10 and which is fed to one input of the control amplifier 3, from the temperature estimator 1 exceeds the voltage corresponding to the maximum temperature value $T_{max}$, the control amplifier 3 generates an output signal that turns on a transistor 8 in the clamping circuit 2. The conductance of the turned-on transistor 8 determines how far the clamping voltage Vc is reduced. The clamping circuit 2 additionally has a series circuit formed by a zener diode 6 with further zener diodes 7, the latter being bridged by the turned-on transistor 8. The zener diode 6 (D1) prescribes the minimum clamping voltage required. Instead of using a zener diode 6, it is possible, as an alternative, to measure the change in the load current through the power transistor 10 with respect to time and to correct the minimum clamping voltage such that the change in the load current with respect to time does not become positive.

It is clear to the relevant persons skilled in the art that the power switch arrangement according to the invention, which forms a low-side switch in FIGS. 2 and 3 (as already in FIG. 1), may equally be embodied as a high-side switch. The power transistor 10 is an n-channel MOSFET merely by way of example and may equally be a p-channel MOSFET. Equally, the arrangement of the series-connected diodes 6 and 7 in the clamping circuit 2 is merely by way of example and it is possible to choose any suitable circuit arrangement for the clamping circuit 2 which ensures that the clamping voltage is reduced with respect to time as soon as the control amplifier 3 generates its output signal and which can prescribe a specific minimum clamping voltage.

Figure 1:
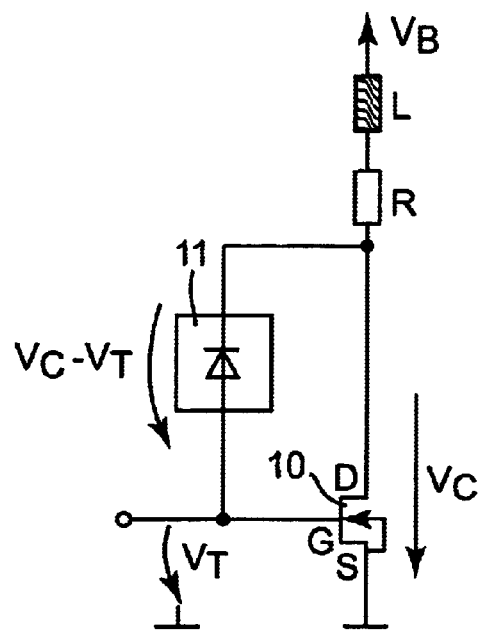
FIG. 1 illustrates a circuit arrangement of the known power switch arrangement already explained in the introduction.
Figure 4:
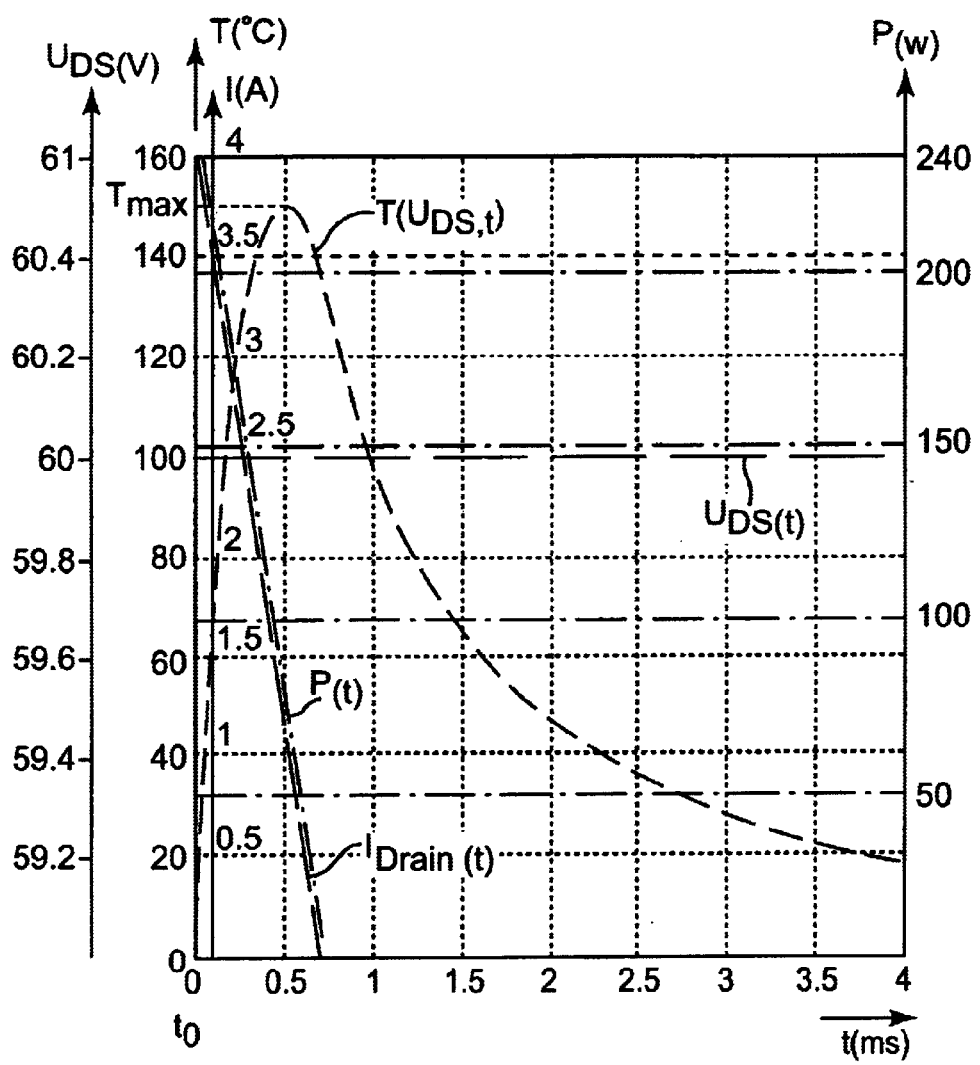
FIG. 4 is a signal timing diagram illustrating the temporal profile of essential quantities of the customary power switch arrangement illustrated in FIG. 1.

The accompanying FIG. 4 graphically illustrates an exemplary profile of a plurality of quantities in the case of the customary power switch arrangement shown in FIG. 1 during a few milliseconds after the turn-off instant t0. The illustration shows:

the temporal profile of $U_{DS}(t)$ of the drain/source voltage;

the temporal profile of the temperature $T(U_{DS}, t)$ of the power transistor 10; and the temporal profile of the load current $I_{Drain}(t)$ and of the power $P(t)$ converted in the power transistor.

The following parameters are chosen for a simulation:
Battery voltage $V_B$=14 V,
Load current at the switch-off instant t0: 4 amperes, R=3 ohms, L=10 mH,
$V_{cmax}$=60 V and $V_{cmin}$=16 V.

As shown in FIG. 4, the temperature maximum $T_{max}$ is approximately 150° C. and lies about 0.5 ms after the turn-off instant t0. The clamping voltage is constant throughout the entire time. The converted power $P(t)$ has the same temporal profile as the load current $I_{Drain}(t)$.

FIG. 5 shows graphically the simulation results, that is to say, the simulated temporal profile of the same quantities as in FIG. 4 during the turn-off operation with the above simulation parameters and an optimized profile of the output voltage $U_{DS}(t)$. During the optimized turn-off operation illustrated, the temperature maximum is limited to about 95° C. in accordance with the set value $T_{max}$. From the instant t0 to the instant t1, the clamping circuit reduces the clamping voltage and hence the output voltage $U_{DS}$ as far as the minimum voltage prescribed by the zener diode 6. Starting from the instant t1, $U_{DS}$ is increased first of all gradually and then very rapidly again. In this case, the temperature of the power transistor 10 remains, until about 2 ms after the turn-off instant t0, at the limited value $T_{max}$=95° C. achieved by means of the optimized profile of $U_{DS}(t)$ and then falls rapidly in accordance with the decrease in the power $P(t)$. If, in the case of the power switch arrangement shown in FIG. 1, the temperature were to be kept below 95° C. without an optimized profile of $U_{DS}$, in this example it would be necessary to reduce the energy in the coil from 80 mJ to 45 mJ. This corresponds to a higher energy absorption capability of a power switch arrangement according to the invention of 77%. Consequently, a power switch arrangement configured according to the invention makes it possible either to use smaller power transistors, which is reflected directly in the chip area, or, given the same chip area, to increase the robustness of an integrated circuit chip containing the power switch arrangement.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power switch arrangement comprising:
    a semiconductor power switch having a control electrode terminal, a load-side electrode terminal, a load path and a maximum desired temperature, wherein the semiconductor power switch is connected by its load path serially in a load circuit;
    a clamping circuit connected between the control electrode terminal and the load-side electrode terminal of the semiconductor power switch, wherein turn-off of the semiconductor power switch occurs at a turn-off instant and sets a clamping voltage across the load path;
    a temperature estimator that supplies an estimated temperature value corresponding to an instantaneous peak temperature of the semiconductor power switch that occurs directly after the turn-off instant of the semiconductor power switch; and
    a control device that generates, after the turn-off instant, a control signal that is fed to the clamping circuit if the estimated temperature value exceeds the maximum desired temperature of said semiconductor power switch, wherein the control device controls the clamping circuit in such a way that the clamping circuit sets the clamping voltage such that the instantaneous peak temperature does not exceed the maximum desired temperature, wherein a minimum voltage value of the clamping voltage is not exceeded, and wherein the minimum voltage value is determined in such a way that a change in load current through the semiconductor power switch with respect to time does not become positive and is subsequently increased, first gradually and then very rapidly.

2. The power switch arrangement of claim 1, wherein the arrangement is set up for switching inductive loads.

3. The power switch arrangement of claim 1, wherein the semiconductor power switch is a MOS-FET.

4. The power switch arrangement of claim 2, wherein the semiconductor power switch is a MOS-FET.

5. The power switch arrangement of claim 1, wherein the clamping circuit, when turn-off of the semiconductor power switch occurs, additionally prescribes a minimum clamping voltage that is high enough to prevent the load current from rising again.

6. The power switch arrangement of claim 2, wherein the clamping circuit, when turn-off of the semiconductor power switch occurs, additionally prescribes a minimum clamping voltage that is high enough to prevent the load current from rising again.

7. The power switch arrangement of claim 1, wherein the temperature estimator has a temperature sensor for detecting the instantaneous temperature of the semiconductor power switch.

8. The power switch arrangement of claim 2, wherein the temperature estimator has a temperature sensor for detecting the instantaneous temperature of the semiconductor power switch.

9. The power switch arrangement of claim 1, wherein the control device has a control amplifier, which, on the input side, receives a voltage—specifying the estimated temperature value—from the temperature estimator and a voltage specifying the maximum desired temperature and generates an output voltage specifying an actuating signal from a comparison of the two received voltage values.

10. The power switch arrangement of claim 9, wherein the clamping circuit has a transistor, which receives the output voltage from the control amplifier at a control electrode, and a series circuit comprising at least a first zener diode, with a further zener diode, the transistor being turned on upon the reception of the actuating signal and bridging the first zener diode and the further zener diode prescribing the minimum clamping voltage.

11. The power switch arrangement of claim 10, wherein the clamping circuit adjusts the minimum clamping voltage to a maximum permissible battery voltage of a battery which feeds the load current.

12. The power switch arrangement of claim 1, wherein the arrangement forms a low-side switch in which the load lies on a side of the semiconductor power switch with higher potential.

13. A method for effecting turn-off of a power switch arrangement comprising:

setting a clamping voltage across a load path of a semiconductor power switch;

connecting the load path serially in a load circuit;

determining an estimated value for an instantaneous peak temperature of the semiconductor power switch; and reducing the clamping voltage if the estimated instantaneous peak temperature exceeds a predetermined maximum temperature.

14. The method of claim 13, further including prescribing a minimum voltage for the clamping voltage in order to prevent a turned-off load current from rising.

15. The method of claim 13, wherein the estimated value for the instantaneous peak temperature is determined in a manner dependent on a measured temperature of the semiconductor power switch.

16. The method of claim 14, wherein the estimated value for the instantaneous peak temperature is determined in a manner dependent on a measured temperature of the semiconductor power switch.

17. The method of claim 13, wherein the semiconductor power switch is used for turning off inductive loads.

18. The method of claim 14, wherein the semiconductor power switch is used for turning off inductive loads.

19. The method of claim 15, wherein the semiconductor power switch is used for turning off inductive loads.

20. A power switch arrangement comprising:

a load circuit having a load current;

a semiconductor power switch having a control electrode terminal, a load-side electrode terminal a load path, an instantaneous peak temperature and a maximum desired temperature, the semiconductor power switch connected by its load path serially to the load circuit;

a clamping circuit connected between the control electrode terminal and the load-side electrode terminal of the semiconductor power switch, wherein turn-off of the semiconductor power switch occurs at a turn-off instant thereby setting a clamping voltage across the load path;

a temperature estimator supplying an estimated temperature value corresponding to the instantaneous peak temperature that occurs directly after the turn-off instant;

a control device that generates a control signal after the turn-off instant, the control signal being fed to the clamping circuit if the estimated temperature value exceeds the maximum desired temperature of said semiconductor power switch; and wherein the control device controls the clamping circuit such that a clamping voltage is set so the protected peak temperature does not exceed the maximum desired temperature and a minimum voltage value of the clamping voltage is not exceeded, the minimum voltage value of the clamping voltage determined such that any change in the load current through the semiconductor power switch with respect to time does not become positive and is subsequently increased.

* * * * *